(12) United States Patent
Doria et al.

(10) Patent No.: US 11,810,836 B2
(45) Date of Patent: Nov. 7, 2023

(54) SYSTEMS FOR PROVIDING THERMAL MANAGEMENT TO INTEGRATED CIRCUITS

(71) Applicant: Arista Networks, Inc., Santa Clara, CA (US)

(72) Inventors: Tiffany Doria, Fremont, CA (US); Robert Morris Wilcox, Saratoga, CA (US); Richard Neville Hibbs, Redwood City, CA (US); Tiong Khai Soo, Milpitas, CA (US); Ernest M. Thurlow, Mountain View, CA (US); Zidong Lin, San Jose, CA (US)

(73) Assignee: Arista Networks, Inc., Santa Clara, CA (US)

(*) Notice: Subject to any disclaimer, the term of this patent is extended or adjusted under 35 U.S.C. 154(b) by 543 days.

(21) Appl. No.: 16/896,637

(22) Filed: Jun. 9, 2020

(65) Prior Publication Data
US 2021/0384104 A1    Dec. 9, 2021

(51) Int. Cl.
*H01L 23/427*   (2006.01)
*H01L 23/40*    (2006.01)
*H05K 7/20*     (2006.01)
*H05K 1/02*     (2006.01)

(52) U.S. Cl.
CPC ........ *H01L 23/427* (2013.01); *H01L 23/4006* (2013.01); *H05K 1/0204* (2013.01);
(Continued)

(58) Field of Classification Search
CPC ............. H05K 7/20154; H05K 7/2029; H05K 7/20236; H05K 7/20309–20327;
(Continued)

(56) References Cited

U.S. PATENT DOCUMENTS 6,212,074 B1 * 4/2001 Gonsalves .......... H01L 23/4275
174/16.3
6,807,061 B1 * 10/2004 Harris ................. H01L 23/3675
257/E23.101
(Continued)

OTHER PUBLICATIONS

George Meyer, CEO, Celsia, Inc.; "A Practical Guide for Using Liquid Two-Phase Heat Sinks"; Thermal Live 2015; Oct. 12, 2015 (https://thermal.live/2015/a-practical-guide-to-using-two-phase-heat-sinks/).
(Continued)

*Primary Examiner* — Amir A Jalali
(74) *Attorney, Agent, or Firm* — Tianyi He (57) ABSTRACT

A processing unit disposed within a compute unit, where the compute unit includes a printed circuit board (PCB) that includes an integrated circuit; a first thermal management device, that includes a first vapor chamber thermally conductively coupled to a first side of the integrated circuit; and a first heatsink thermally conductively coupled to the first vapor chamber; and a second thermal management device, that includes a second vapor chamber; and a second heatsink thermally conductively coupled to the second vapor chamber, where the second thermal management device is thermally conductively coupled to the first thermal management device; where the PCB is interposed between the first thermal management device and the second thermal management device.

20 Claims, 7 Drawing Sheets

(52) U.S. Cl.
CPC .... *H05K 7/20154* (2013.01); *H01L 2023/405* (2013.01); *H01L 2023/4062* (2013.01); *H01L 2023/4087* (2013.01)

(58) Field of Classification Search
CPC .......... H05K 7/20663; H05K 7/20681; H05K 7/20709; H05K 7/20818; H05K 7/20827; H05K 7/20881; H05K 7/209; H05K 7/20936; H05K 1/0203–0204; H01L 23/427; H01L 23/473; H01L 23/31; H01L 23/34; H01L 23/36; H01L 23/3677; H01L 23/3733; H01L 23/3737; H01L 23/4006; H01L 2023/405; H01L 2023/4062; H01L 2023/4087; F28D 15/02; F28D 15/0266; F28D 15/0275
See application file for complete search history.

(56) References Cited

U.S. PATENT DOCUMENTS

| | | | | |
|---|---|---|---|---|
| 7,295,441 | B1 * | 11/2007 | Laio | H01L 23/427 |
| | | | | 257/713 |
| 9,069,532 | B2 * | 6/2015 | Campbell | H05K 7/20809 |
| 9,974,157 | B2 * | 5/2018 | de Bock | H05K 7/20672 |
| 10,107,557 | B2 * | 10/2018 | Lan | F28D 15/04 |
| 10,281,220 | B1 | 5/2019 | Lin et al. | |
| 10,451,355 | B2 * | 10/2019 | Lan | H01L 21/4882 |
| 10,591,964 | B1 * | 3/2020 | Mikjaniec | H05K 7/208 |
| 10,616,993 | B1 * | 4/2020 | Gawlowski | H05K 1/0203 |
| 10,660,236 | B2 | 5/2020 | Rush et al. | |
| 11,011,449 | B1 * | 5/2021 | Qu | G11C 5/025 |
| 2010/0188811 | A1 * | 7/2010 | Liang | G06F 1/20 |
| | | | | 361/679.52 |
| 2017/0156240 | A1 * | 6/2017 | Silvennoinen | H01L 23/427 |

OTHER PUBLICATIONS

George Meyer, CEO, Celsia, Inc.; "Heat Pipes & Vapor Chambers: Design Guidelines"; Thermal Live 2016; Oct. 4, 2016 (https://semi-therm.org/wp-content/uploads/2017/04/Heat-Pipe-Vapor-Chamber-Heat-Sink-Design-Guidelines-Thermal-Live-2016.pptx.pdf).
International Search Report and Written Opinion dated Sep. 15, 2021 for corresponding PCT Application No. PCT/US2021/020087.

* cited by examiner

SYSTEMS FOR PROVIDING THERMAL MANAGEMENT TO INTEGRATED CIRCUITS

BACKGROUND

In some compact computing environments, there may be a limited amount of open physical space to place additional components. Accordingly, there may be difficulty in designing compute units to fit within the given space constraints. In such scenarios, it may be desirable to design compute units that efficiently use the existing space.

SUMMARY

In general, in one aspect, embodiments relate to a processing unit disposed within a compute unit, where the compute unit includes a printed circuit board (PCB) that includes an integrated circuit; a first thermal management device, that includes a first vapor chamber conductively coupled to a first side of the integrated circuit; and a first heatsink conductively coupled to the first vapor chamber; and a second thermal management device, that includes a second vapor chamber; and a second heatsink conductively coupled to the second vapor chamber, where the second thermal management device is conductively coupled to the first thermal management device; where the PCB is interposed between the first thermal management device and the second thermal management device.

In general, in one aspect, embodiments relate to a processing unit, that includes an integrated circuit; a first thermal management device, that includes a first vapor chamber conductively coupled to a first side of the integrated circuit; and a first heatsink conductively coupled to the first vapor chamber; and a second thermal management device, that includes a second vapor chamber; and a second heatsink conductively coupled to the second vapor chamber, where the second thermal management device is conductively coupled to the first thermal management device.

In general, in one aspect, embodiments relate to a processing unit that includes an integrated circuit; a first thermal management device, that includes a first vapor chamber conductively coupled to a first side of the integrated circuit; and a first heatsink conductively coupled to the first vapor chamber; and a second thermal management device, that includes a second vapor chamber; and a second heatsink conductively coupled to the second vapor chamber, where the second thermal management device is conductively coupled to the first thermal management device; an air mover configured to force a movement of gaseous matter towards the first thermal management device, where the first heatsink includes fins, and where the fins are oriented to align with the movement of gaseous matter.

Other aspects will be apparent from the following description and the appended claims.

DETAILED DESCRIPTION

In conventional processing units, integrated circuits (e.g., processors, application specific integrated circuits (ASICs), field programmable gate arrays (FPGAs), etc.) often operate most efficiently within a certain temperature range. However, due to their significant power usage, integrated circuits generate considerable heat and rise to a temperature beyond that ideal range, often forcing the integrated circuit to sacrifice performance by reducing power to avoid damage from heat. Thus, integrated circuits are often coupled to a thermal management device that removes heat from the integrated circuit, thereby allowing operation at a desired temperature and power level.

However, as integrated circuits become more computationally powerful, more power is drawn to support that additional performance, and consequently heat is generated at ever higher rates. Thus, a problem arises when existing thermal management devices cannot remove heat at a sufficient rate and the integrated circuit begins to operate outside of the preferred temperature range (in turn reducing power consumption and sacrificing performance). Further, this problem is exacerbated when the physical constraints of the computing system do not allow for insertion of additional thermal management devices.

That is, depending on the constraints of the computing system, certain types of thermal management devices may be suitable or unsuitable to regulate the temperature of an integrated circuit. For example, in an open and accessible environment, a forced liquid cooling system may be utilized for rapid heat removal. Whereas, in an environment that lacks ample free space and/or requires low maintenance components—passive heat exchange elements (e.g., fins, vapor chambers, heat pipes, etc.) may be utilized due to their low maintenance reliability and suitability for small and hard-to-access areas.

To solve the problem of insufficient heat removal in a limited space environment, one or more embodiments described herein provides that one or more existing component(s) near and/or affixed to the integrated circuit be replaced with one or more thermal management device(s). For example, in one embodiment, instead of affixing the printed circuit board (PCB) (holding the integrated circuit) to a conventional "backing plate", the PCB may, instead, be affixed to an additional thermal management device which also serves the same structural functions as a backing plate. Thus, an integrated circuit may be coupled to two or more thermal management devices, enabling the removal of heat from two or more sides of the integrated circuit. Further, as an existing part (e.g., a backing plate) is replaced with a thermal management device—instead of the addition of another thermal management device—the limited space within the computing device is more efficiently utilized.

As an example, in one or more embodiments, one side of an integrated circuit may be mounted to a PCB while the opposite side of the integrated circuit is conductively coupled to a first thermal management device. Then, a second thermal management device may be disposed on the opposite side of the PCB—instead of a conventional backing plate—and mechanically coupled to the first thermal management device. Thus, the integrated circuit is pressured between the first thermal management device and the PCB via the mechanical coupling of the first and second thermal management devices. And, in such a configuration, heat may be removed from the integrated circuit by both thermal management devices. That is, in addition to the first thermal management device being conductively coupled to the integrated circuit, the second thermal management device may also be conductively coupled the integrated circuit and may remove heat from the integrated circuit, for example, via conductive pathways traversing the PCB and/or through the PCB material itself.

In one or more embodiments, the first and second thermal management devices may each include vapor chambers, and in such a configuration, the combination of thermal management devices may be referred to as a "double vapor chamber heat sink assembly." Further, in one or more embodiments, one or both of the thermal management devices may be constructed of two or more vapor chambers, mechanically coupled to form a larger thermal management device. As an example, the second thermal management device may be assembled from three independent vapor chambers to form a single structure capable of performing the structural functions of a backing plate. Further, each thermal management device may include two or more different types of mechanisms for removing heat (e.g., a vapor chamber conductively coupled to fins to allow for heat removal via forced convection).

In one or more embodiments, the first and second thermal management devices may be thermally conductively coupled to each other to enable the transfer of heat from the hotter thermal management device. For example, the first thermal management device—being provided greater thermal conductivity with the integrated circuit (i.e., without an PCB interposed between)—may remove a majority of the heat from the integrated circuit. Consequently, the second thermal management device may remove heat from the first thermal management device through their shared thermally conductive coupling. Thus, in addition to removing heat from the integrated circuit, the second thermal management device may additionally remove heat from the first thermal management device (further indirectly removing heat from the integrated circuit).

In one or more embodiments, the first and second thermal management devices may conductively couple to each other via one or more protrusions of either (or both) of the thermal management devices. For example, in one or more embodiments, the first and/or second thermal management device may include one or more protrusions (i.e., a physical protuberance) of the thermal management device that extends towards (and thermally couples with) the other thermal management device. In a configuration where each thermal management device includes protrusions, one or more protrusions of one thermal management device may extend to conductively couple with the body and/or one or more protrusions of the other thermal management device. Further, the PCB disposed between the first and second thermal management devices may include one or more through holes (i.e., an unobstructed opening), through which one or more protrusions may respectively traverse, to allow for the conductive coupling of the thermal management devices.

Figure 1:
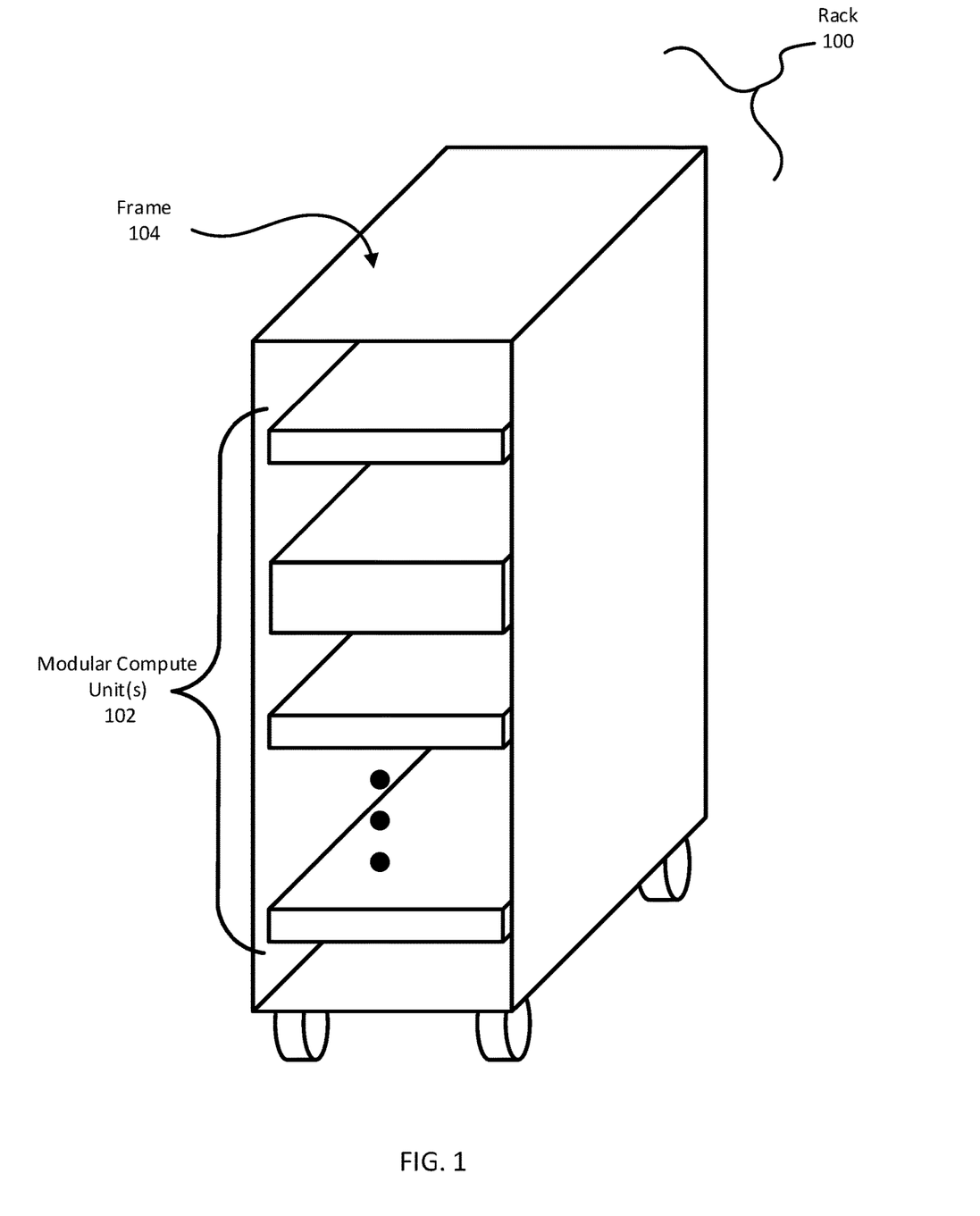
FIG. 1 shows an example rack, in accordance with one or more embodiments.

FIG. 1 shows an example rack in accordance with one or more embodiments. A rack (e.g., rack (100)) may include a frame (e.g., frame (104)) and one or more modular compute unit(s) (e.g., modular compute unit(s) (102), which may be referred to as a "compute unit" generally herein). One or more components of rack (100) and/or frame (104) may include components that enable the ability to mount one or more modular compute unit(s) (102) to frame (104). In general, rack (100) may be configured to accept one or more modular compute unit(s) (102) of a standardized height (e.g., a "rack unit" (RU)) or some multiple thereof. Further, to utilize space more efficiently within rack (100), the gaps between modular compute units (102) may be minimized thereby creating a more compact hardware environment. Further, by creating standardized units of height for modular compute units (102), design of module compute unit(s) (102) may be specifically tailored to optimize a standard constrained geometry (i.e., avoid using only a small portion of an adjacent space) thereby allowing for compact placement among equipment of different manufacturers. By doing so, modular compute unit(s) (102) may be assembled in a high-density computing environment.

In one or more embodiments, a rack (e.g., rack (100)) is a physical structure. Rack (100) may include frame (104) which may be adapted to facilitate storage of one or more modular compute unit(s) (102) in a high-density computing environment. The high-density computing environment may be, for example, a data center or another type of location where one or more modular compute unit(s) (102) are located.

In one or more embodiments, a frame (e.g., frame (104)) is the outer structure of rack (100) and may be constructed using any number of suitable materials. As non-limiting examples, some or all of frame (104) may be constructed using metals (e.g., steel, aluminum, etc.), polymers (e.g., polyamides, polycarbonates, polyester, polyethylene, polypropylene, polystyrene, polyurethanes, polyvinyl chloride, etc.), and/or rubber (e.g., latex, styrene-butadiene rubbers, etc.). One of ordinary skill in the art, having the benefit of this Detailed Description, would appreciate that frame (104) may be implemented using any quantity and combination of suitable materials without departing from the scope.

To facilitate mounting of one or more modular compute unit(s) (102), frame (104) may include any number of structural members (e.g., beams, brackets, bars, etc.) and any number of mechanical mounting points (e.g., holes, threaded portions, etc.) disposed on the structural members to facilitate storage of one or more modular compute unit(s) (102). Different structural members may have different shapes, sizes, and/or other physical characteristics. The shapes, sizes, and/or other physical characteristics of the structural members may be adapted to enable the structural members to be mechanically connected (e.g., permanently connected or detachably connected) to other structural members to form a predetermined structure. The predetermined structure may be, for example, a cage, box, or other type of structure that facilitates positioning and/or orienting one or more modular compute unit(s) (102).

While FIG. 1 shows a rack according to one or more embodiments, other configurations may be used without departing from the scope. For example, although illustrated as including a limited number of components, rack (100) may include any number of frames (e.g., frame (104)), modular compute unit(s) (e.g., modular compute unit(s) (102)), and/or other components without departing from the scope. Accordingly, embodiments disclosed herein should not be limited to the configuration of devices and/or components shown in FIG. 1.

Figure 2:
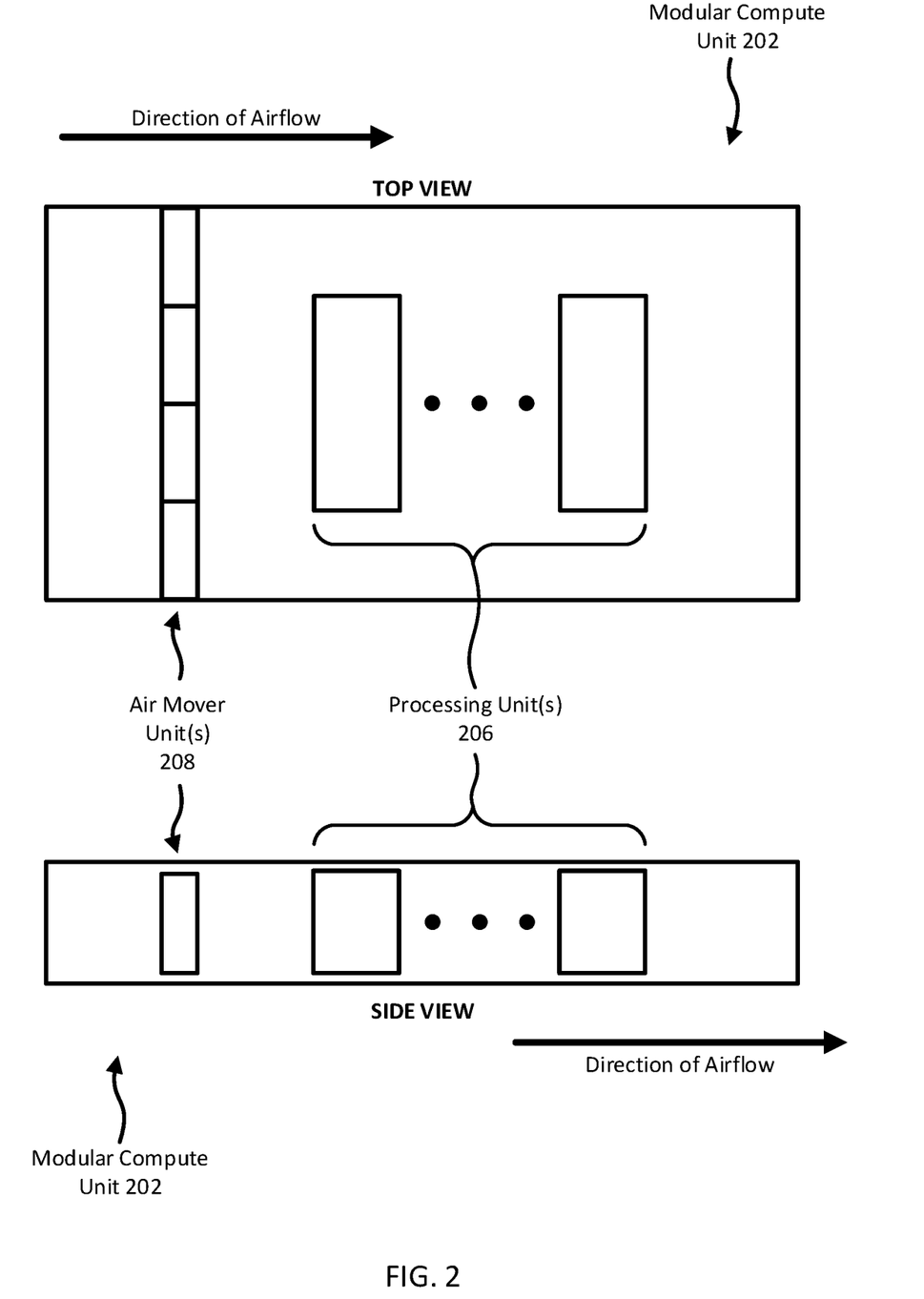
FIG. 2 shows an example modular compute unit, in accordance with one or more embodiments.

FIG. 2 shows an example modular compute unit, in accordance with one or more embodiments. Specifically, FIG. 2 shows a top view and side view of a modular compute unit (e.g., modular compute unit (202)) and one or more component(s) therein. In one or more embodiments, a modular compute unit (e.g., modular compute unit (202)) is physical structure that includes an empty volume suitable to include one or more processing unit(s) (e.g., processing unit(s) (206)) and one or more air mover unit(s) (e.g., air move unit(s) (208)).

In one embodiment, a chassis forms the exterior structure of modular compute unit (202). A chassis may be a mechanical structure that is adapted to (i) facilitate attachment of modular compute unit (202) to a frame of a rack (as discussed in the description of FIG. 1), (ii) house processing unit(s) (206) and/or air mover unit(s) (208), (iii) provide electrical (power and/or data) operative connection(s) to processing unit(s) (206), and/or (iv) provide thermal management services to processing unit(s) (206) of modular compute unit (202) (e.g., via air mover unit(s) (208)). More detail regarding the description of processing unit (206) and the components therein is provided in the description of FIGS. 3A-4C.

The chassis of modular compute unit (202) may be constructed using any number of suitable materials. As non-limiting examples, some or all of the chassis of modular compute unit (202) may be constructed using metals (e.g., steel, aluminum, etc.), polymers (e.g., polyamides, polycarbonates, polyester, polyethylene, polypropylene, polystyrene, polyurethanes, polyvinyl chloride, etc.), and/or rubber (e.g., latex, styrene-butadiene rubbers, etc.). One of ordinary skill in the art, having the benefit of this Detailed Description, would appreciate that the chassis of modular compute unit (202) may be implemented using any quantity and combination of suitable materials without departing from the scope.

In one embodiment, modular compute unit (202) provides electrical power (e.g., power) to processing unit(s) (206) and air mover units(s) (208) via one or more electrically conductive operative connection(s) (e.g., metallic contacts and/or wire(s) terminated with a plug and socket). Modular compute unit (202) may be provided power from a rack (not shown) or via some other source.

To provide thermal management services to processing unit(s) (206) and/or other devices, modular compute unit (202) may facilitate the flow of gas proximate to the processing unit(s) (206) and/or other devices via air mover unit(s) (208). By doing so, the thermal state (i.e., temperature) of the aforementioned devices may be regulated (i.e., maintained within a preferred temperature range). As a non-limiting example, modular compute unit (202) may include one or more vents that allow gaseous matter (e.g., air) to flow into a first side of modular compute unit (202), through modular compute unit (202) via air mover unit(s) (208), and out a second side of modular compute unit (202). The gas, flowing through modular compute unit (202), may be at a different temperature than processing unit(s) (206) and/or other devices. Consequently, thermal exchange between the flow of the gaseous matter and the aforementioned devices may occur resulting in the temperature of the aforementioned devices changing. By doing so, heat generated by the aforementioned devices may be expelled from the devices thereby regulating the temperature of the aforementioned devices.

While FIG. 2 shows an example of modular compute unit, other configurations may be used without departing from the scope. Accordingly, embodiments disclosed herein should not be limited to the configuration of devices and/or components shown in FIG. 2.

Figure 3A:
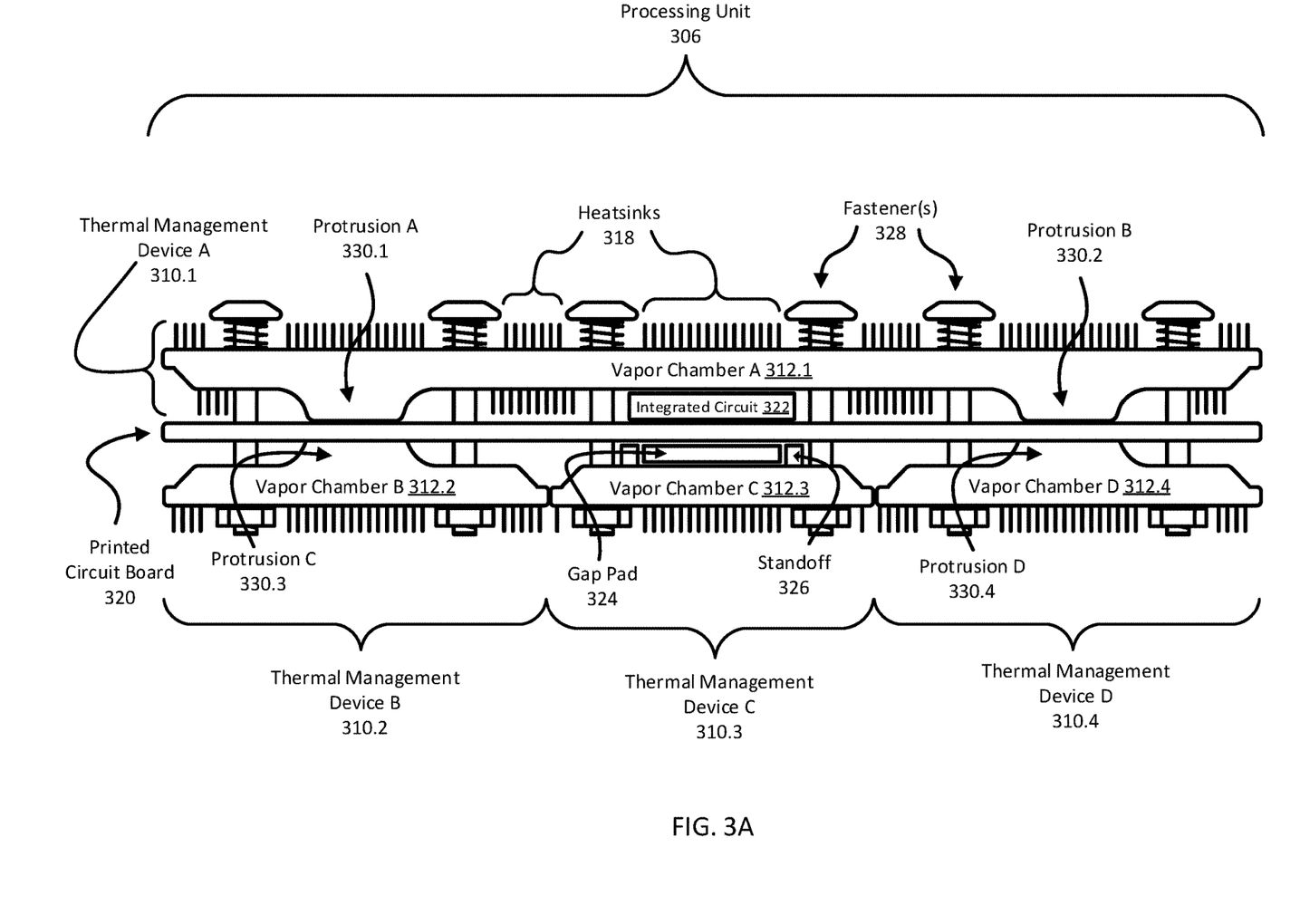
FIG. 3A shows an example of a processing unit, in accordance with one or more embodiments.

FIG. 3A shows an example of a processing unit, in accordance with one or more embodiments. In one or more embodiments, a processing unit (e.g., processing unit (306)) includes a printed circuit board (e.g., printed circuit board (320)) thermally coupled to one or more thermal management device(s) (e.g., thermal management device A (310.1), thermal management device B (310.2), thermal management device C (310.3), thermal management device D (310.4)) and one or more fastener(s) (e.g., fastener(s) (328)) that mechanically couple the components together. Further, in one or more embodiments, processing unit (306) may include several similarly constructed thermal management devices (e.g., thermal management device B (310.2) and thermal management device D (310.4) as shown in FIG. 3A). Each of these components is described below.

In one or more embodiments, a printed circuit board (e.g., printed circuit board (320)) is structure that provides mechanical attachment and electrically conductive pathways to one or more electrical components mounted thereon (e.g., integrated circuit (322)). In one or more embodiments, printed circuit board (320) may be constructed of several layers that provide electrically conductive pathways surrounded by non-electrically conductive material (i.e., insulators). In one or more embodiments, printed circuit board (320) is interposed between two or more thermal management devices (310.1, 310.2, 310.3, 310.4) and may include one or more through holes (not shown) to allow one or more respective protrusions (330.1, 330.2, 330.3, 330.4) (described below) to traverse the thickness of printed circuit board (320).

In one or more embodiments, an integrated circuit (e.g., integrated circuit (322)) is a combination of two or more electronic circuits packaged onto a single electronic chip. Non-limiting examples of types of an integrated circuit (322) include processors (in the form of cores and/or microcores), storage devices (e.g., flash memory, random access memory (RAM), dynamic RAM (DRAM), resistive RAM (ReRAM), Content Addressable Memory (CAM), Ternary CAM (TCAM), etc.), configurable and/or configured circuits (e.g., application specific integrated circuits (ASICs), field programmable gate arrays (FPGAs)). Further, in one or more embodiments, integrated circuit (322) may combine one or more circuit-based devices onto a single chip (e.g., an advanced reduced instruction set computer (RISC) machine (ARM) processor core combined with an ASIC). One of ordinary skill in the art, having the benefit of this Detailed Description, would appreciate that that an integrated circuit (e.g., integrated circuit (322)) may take several forms and be used for any suitable purpose.

In one or more embodiments, a thermal management device (e.g., thermal management device A (310.1), thermal management device B (310.2), thermal management device C (310.3), thermal management device D (310.4)) is a device that removes heat from a hot component (e.g., integrated circuit (322) and/or other thermal management devices (e.g., 310.1, 310.2, 310.3, 310.4)). In one or more embodiments, thermal management device (310.1, 310.2, 310.3, 310.4) removes heat from a hot component via thermally conductive contact and dissipates the heat to the surrounding environment (e.g., via forced convection caused by one or more air mover unit(s) (not shown) external to processing unit (306)).

In one or more embodiments, a thermal management device (e.g., 310.1, 310.2, 310.3, 310.4) may be a composite device that includes one or more heat transfer devices, including a vapor chamber (e.g., vapor chamber A (312.1), vapor chamber B (312.2), vapor chamber C (312.3), vapor chamber D (312.4)) and heatsinks (e.g., heatsinks (318)), in addition to structural elements that enable mechanical and/or thermally conductive coupling to other components, including one or more standoff(s) (e.g., standoff (326)) and a gap pad (e.g., gap pad (324)). Each of these components is described below.

In one or more embodiments, a vapor chamber (e.g., vapor chamber A (312.1), vapor chamber B (312.2), vapor chamber C (312.3), vapor chamber D (312.4)) is a passive heat exchanger that includes an internal volume that provides an isolated environment for fluid heat transfer. In one or more embodiments, a vapor chamber (e.g., 312.1, 312.2, 312.3, 312.4) is a heat pipe that includes a porous wick and a fluid that cyclically transitions from liquid to gas and back to liquid while removing heat from a thermally coupled component (e.g., integrated circuit (322) and/or other thermal management devices (e.g., 310.1, 310.2, 310.3, 310.4)). In one or more embodiments, the exterior of vapor chamber (312.1, 312.2, 312.3, 312.4) is constructed using a rigid thermal conductor (e.g., any solid metal (e.g., copper)), a rigid thermal conductor that is also an electrical insulator (e.g., certain ceramics, diamond, etc.), and/or a semi-rigid (e.g., flexible, ductile, malleable, etc.) composite material that combines one or more materials (e.g., silicone polymers with dispersed ceramic particles) and allows for electrical insulation, thermal conduction, and ductility.

In one or more embodiments, a vapor chamber (e.g., 312.1, 312.2, 312.3, 312.4) is constructed to allow the internal fluid, when in liquid form, to flow nearest the hot component (e.g., integrated circuit (322)) where heat is thermally transferred from the hot component to the liquid, thereby causing the liquid fluid to vaporize into a gaseous fluid. In turn, the gaseous fluid circulates through the vapor chamber (e.g., 312.1, 312.2, 312.3, 312.4) to a comparatively colder (i.e., less hot) location where the gaseous vapor is cooled back into the liquid phase of matter (e.g., heat may be removed via a heatsinks (318) thermally coupled to the exterior of the vapor chamber). Once the fluid is again in liquid form, the vapor chamber (e.g., 312.1, 312.2, 312.3, 312.4) is constructed to allow the liquid fluid to flow back to the internal portion of the vapor chamber nearest the hot component (e.g., either by gravity and/or through the capillary action of the porous wick lining the vapor chamber). Once near the hot component, the liquid may vaporize into a gas again, thereby repeating the heat exchange cycle. One of ordinary skill in the art, having the benefit of this Detailed Description, would appreciate the basic function and design of vapor chambers (e.g., 312.1, 312.2, 312.3, 312.4) and/or heat pipes generally. In one or more embodiments, a vapor chamber (e.g., 312.1, 312.2, 312.3, 312.4) includes one or more protrusions (e.g., protrusion A (330.1), protrusion B (330.2), protrusion C (330.3), protrusion D (330.4)), described below.

In one or more embodiments, a protrusion (e.g., protrusion A (330.1), protrusion B (330.2), protrusion C (330.3), protrusion D (312.4)) is a physical protuberance (i.e., bulge, bump, projection, etc.) that elongates a portion of the vapor chamber (e.g., 312.1, 312.2, 312.4) in a particular direction. In one or more embodiments, protrusion (330.1, 330.2, 330.3, 330.4) may be used to provide thermal coupling between two or more thermal management devices (e.g., 310.1, 310.2, 310.4) (and/or vapor chambers (312.1, 312.2, 312.4) thereof).

As a non-limiting examples, as shown in FIG. 3A, protrusion A (330.1) extends downwards and makes physical contact and thermally conductive coupling with protrusion C (330.3). Accordingly, via the thermally conductive coupling of protrusion A (330.1) with protrusion C (330.3), vapor chamber A (312.1) is accordingly thermally coupled to vapor chamber B (312.2) (also thermally coupling thermal management device A (310.1) to thermal management device B (310.2)). Further, as shown in FIG. 3A, vapor chamber A (312.1) may include two protrusions (protrusion A (330.1) and protrusion B (330.2)) each making independent contact with two unique protrusions (protrusion C (330.3) and protrusion D (330.4), respectively) of two unique vapor chambers (vapor chamber B (312.2) and vapor chamber D (312.4), respectively).

In one or more embodiments, one or more protrusions(s) (e.g., 330.1, 330.2) may contact other protrusion(s) (e.g., 330.3, 330.4) at different heights. As a non-limiting example, protrusion A (330.1) and protrusion B (330.2) may not elongate as much as protrusion C (330.3) and protrusion D (312.4) such that the protrusions make thermally conductive contact above the surface of printed circuit board (320) (i.e., closer to the inner surface of thermal management device A (310.1) than the other thermal management devices (310.2, 310.3, 310.3)). Conversely, as another non-limiting example, protrusion C (330.3) and protrusion D (312.4) may not elongate as much as protrusion A (330.1) and protrusion B (330.2) causing the thermally conductive contact between the protrusions (330.1, 330.2, 330.3, 330.4) to occur below printed circuit board (320). One of ordinary skill in the art, having the benefit of this Detailed Description, would appreciate that opposing protrusions (e.g., 330.1 and 330.3, 330.2 and 330.4) may contact each other at any height between the thermal management device inner surfaces (e.g., above or below printed circuit board (320), parallel to either surface of printed circuit board (320), and/or within the thickness of printed circuit board (320) (i.e., in a through hole)).

As another non-limiting example, one or more vapor chamber(s) (e.g., 312.1) may not include any protrusions (e.g., 330.1, 330.2) such that the opposite protrusions (e.g., 330.3, 330.4) may extend further (e.g., twice as far) towards the opposing thermal management device (e.g., 312.1) in order to make thermally conductive contact. Further, as a non-limiting example, processing unit (306) may not include any protrusions (330.1, 330.2, 330.3, 330.4) on any vapor chamber (312.1, 312.2, 312.3, 312.4). In such a scenario, additional conductive components (not shown) may be inserted between opposing thermal management devices (e.g., 310.1, 310.2, 310.4) so that thermally conductive contact may be achieved. For example, a solid conductive component (e.g., a copper block) may be disposed between the bottom surface of vapor chamber A (312.1) and the top surface of vapor chamber B (312.2) (if neither includes a protrusion) in order to provide thermally conductive contact between thermal management device A (310.1) and thermal management device B (310.2). In one or more embodiments, an additional conductive component that is disposed between opposing thermal management devices (e.g., 310.1, 310.2, 310.4) may be soldered to the inner surface of one or more thermal management device(s) or may be held in place via the compression exerted by fastener(s) (328).

In one or more embodiments, as shown in FIG. 3A, integrated circuit (322) is located on a side of printed circuit board (320) closer to thermal management device A (310.1); accordingly, thermal management device A (310.1) may absorb more heat from integrated circuit (322) than thermal management device B (310.2), thermal management device C (310.3), and/or thermal management device D (310.4). Accordingly, in one or more embodiments, thermal management device A (310.1) (and/or vapor chamber A (312.1) thereof) may lose efficiency due to an inability to remove heat at a sufficient rate in the absence of additional thermal management devices (e.g., if thermal management devices B, C, and D (310.2, 310.3, 310.4) were absent). Thus, when thermal management device B (312.2) is thermally coupled via protrusions A and C (330.1 and 330.3), additional heat may be dissipated from thermal management device A (310.1) allowing for greater heat removal efficiency of integrated circuit (322).

Similarly, in one or more embodiments, as shown in FIG. 3A, thermal management device C (310.3)—located directly under the portion of printed circuit board (320) holding integrated circuit (322)—may also become hotter than thermal management devices B and D (310.2, 310.4). Thus, thermal management device B (310.2) and thermal management device D (310.4) may be thermally coupled to thermal management device C (310.3) thereby also indirectly removing heat via a lateral physical contact (created when fastener(s) (328) mechanically couple the components of processing unit (306)).

In one or more embodiments, a single protrusion (e.g., protrusion A (330.1)) may thermally conductively couple with another vapor chamber (e.g., vapor chamber B (312.2)) without contacting a second protrusion (e.g., protrusion C (330.3) may be absent). In such an embodiment, protrusion A (330.1) may be elongated more than shown in FIG. 3A (i.e., protruding further vertically downward), in order to physically contact vapor chamber B (312.2).

In one or more embodiments, a heatsink (e.g., heatsinks (318)) is a passive heat exchanger that absorbs heat from a thermally coupled component and dissipates that heat into a surrounding fluid (e.g., surrounding air). Heatsinks (318) may be constructed to maximize surface area with a surrounding fluid to maximize the efficiency of heat removal from the heatsink. In one or more embodiments, heatsink (318) is constructed using a rigid thermal conductor (e.g., any solid metal (e.g., copper)), a rigid thermal conductor that is also an electrical insulator (e.g., certain ceramics, diamond, etc.), and/or a semi-rigid (e.g., flexible, ductile, malleable, etc.) composite material that combines one or more materials (e.g., silicone polymers with dispersed ceramic particles) and allows for electrical insulation, thermal conduction, and ductility. In one or more embodiments, heatsinks (318) may be placed on any exterior surface of vapor chamber(s) (312.1, 312.2, 312.3, 312.4) and may be oriented to maximize interstitial gaseous flow caused by an air mover unit (not shown).

Non-limiting examples of a heatsink include fins (one or more elongated and conductive structures that protrude into the surrounding fluid), cavities (indentations and/or holes allowing a surrounding fluid to fill the interstitial space of those cavities), and/or plates (flat surfaces exposed to the surrounding fluid). One of ordinary skill in the art, having the benefit of this Detailed Description, would appreciate that heatsinks may take the form of any passive heat exchanger.

In one or more embodiments, a standoff (e.g., standoff (326)) is a structural elements that allows for the mechanical coupling of a printed circuit board (e.g., 320) to a thermal management device (e.g., thermal management device C (310.3)). In one or more embodiments, standoff (326) is a receptacle for a corresponding mechanical fastener (not shown). As a non-limiting example, standoff(s) (326) may include an internal threaded cylindrical volume that accepts a machine screw and/or bolt to be threaded into the standoff (326). Accordingly, as shown in FIG. 3A, printed circuit board (320) may be mounted to standoff (326) via a machine screw configured to pass through printed circuit board (320) and thread into standoff (326).

In one or more embodiments, a gap pad (e.g., gap pad (324)) is a thermally conductive structure that fills a void created between a printed circuit board (e.g., printed circuit board (320)) and a thermal management device (e.g., thermal management device C (310.3) as shown in FIG. 3A). In one or more embodiments, gap pad (324) may be constructed of any material that increases the thermal conductivity between two devices. As non-limiting examples, gap pad (324) may be constructed of any rigid thermal conductor (e.g., any solid metal (e.g., copper)), rigid thermal conductors that are also electrical insulators (e.g., certain ceramics, diamond, etc.), and/or semi-rigid (e.g., flexible, ductile, malleable, etc.) composite materials that combine one or more materials (e.g., silicone polymers with dispersed ceramic particles) and allows for electrical insulation, thermal conduction, and ductility.

In one or more embodiments, a void (e.g., a volume that includes the surrounding fluid matter of the environment, an "air-filled void") is created between the printed circuit board and one or more thermal management devices (e.g., 310.1, 310.2, 310.3, 310.4) as printed circuit board (320) may be mounted using structural elements (i.e., standoff(s) (326)) that offset the printed circuit board away from the thermal management device (e.g., 310.1, 310.2, 310.3, 310.4). To fill a void and provide thermal conductive coupling between printed circuit board (320) and the thermal management device (e.g., 310.1, 310.2, 310.3, 310.4), a gap pad (e.g., gap pad (324)) may be disposed in the void to fill and/or eliminate the void and also provide thermally conductive contact to the surrounding components.

As a non-limiting example, as shown in FIG. 3A, printed circuit board (320) is mounted to thermal management device C (310.3) via one or more standoff(s) (326); accordingly, the height of standoff(s) (326) displaces printed circuit board (320) away from vapor chamber C (312.3) thereby creating an air-filled void between printed circuit board (320) and vapor chamber C (312.3) (in the absence of gap pad (324)). However, as thermal management device C (310.3) is placed below printed circuit board (320) in order to remove heat from integrated circuit (322), such an air-filled void reduces the effectiveness of vapor chamber C (312.3) (and thermal management device C (310.3) as a whole) because the air-filled void is not as thermally conductive as direct conductive contact through solid matter. Accordingly, to increase the thermally conductive coupling between printed circuit board (320) and thermal management device C (310.3), gap pad (324) is placed therebetween to allow for increased heat removal from printed circuit board (320) (and integrated circuit (322) directly above). In one or more embodiments, thermal management device C (310.3) (and vapor chamber C (312.3) thereof) is against printed circuit board (320) directly opposite integrated circuit (322) and may remove heat from integrated circuit (322) via one or more conductive pathways (e.g., through silicon vias (TSVs)) that traverse printed circuit board (320).

In one or more embodiments, a fastener (e.g., fastener(s) (328)) is hardware that provides means for mechanically coupling one component to another component. Non-limiting examples of a fastener(s) (328) include rigid fasteners (e.g., screws, machine screws, bolts, nuts, nails, pins, cable ties, etc.), semi-rigid fasteners (e.g., adhesive tape, hook-and-loop fasteners, glue, etc.), rigid fasteners that allow for limited movement (e.g., links/chains, ball-and-socket connections, hinges). As shown in FIG. 3A, fastener(s) (328) may be a nut-and-bolt type of rigid mechanical fastener that, when tightened (stressing the fastener), provides compression to the other components of processing unit (306).

In one or more embodiments, a fastener (e.g., 328) may be used to mechanically couple two components and provide pressure to bilateral sides of a third component disposed therebetween. As a non-limiting example, as shown in FIG. 3A, the printed circuit board (320) (and integrated circuit (322) disposed thereon) are pressured between vapor chamber A (312.1) and gap pad (324) via the tightening of the fastener(s) that mechanically couple thermal management device A (310.1) to thermal management device C (310.3). Accordingly, although printed circuit board (320), integrated circuit (322), and gap pad (324) are not indirect contact with any fastener (328), those components are nonetheless mechanically coupled via the pressure created by the fastener(s) (328) on the surrounding thermal management devices A and C (310.1, 310.3).

Similarly, as a non-limiting example, as shown in FIG. 3A, pairs of protrusions (e.g., protrusion A (330.1) and protrusion C (330.3); and protrusion B (330.2 and protrusion D (330.4)) are mechanically coupled (pressured together) through the compressive inward force exerted when fastener(s) (328) are manipulated (e.g., tightened) to cause greater pressure on the exterior surfaces of the vapor chambers (312.1, 312.2, 312.3, 312.4).

In one or more embodiments, a thermally conductive paste ("thermal paste") (not shown) is placed between the physical contacts of any two components that are thermally conductively coupled. Thermal paste may fill any voids that may be created via an imperfect physical coupling, thereby increasing physical contact, thermal conductivity, and overall heat transfer efficiency. As non-limiting examples, a thermal paste may be placed between the integrated circuit (322) and vapor chamber A (312.2), protrusion A (330.1) and protrusion C (330.3), vapor chamber B (312.2) and vapor chamber C (312.3), and any vapor chamber (310.1, 310.2, 310.3, 310.4) and heatsinks (318). In one or more embodiments, thermal paste includes thermally conductive materials (e.g., aluminum oxide, boron nitride, zinc oxide, aluminum nitride, etc.) suspended in an electrically insulated matrix (e.g., epoxies, silicones, urethanes, acrylates, etc.).

While FIG. 3A shows an example of a processing unit, other configurations may be used without departing from the scope. For example, although FIG. 3A shows four separate thermal management devices (e.g., 310.1, 310.2, 310.3, 310.4) mechanically and thermally coupled to a printed circuit board (e.g., 320), the lower three thermal management devices (310.2, 310.3, 310.4) may, instead, be a single thermal management device that spans the length of the processing unit and is shaped similar to thermal management device A (310.1) (e.g., including only a single vapor chamber). As a non-limiting example, in one or more embodiments, there may exist only a single thermal management device (sharing a single vapor chamber with a single internal volume) that is disposed on both sides of printed circuit board (320). Further, as another non-limiting example, two or more integrated circuits (integrated circuit (322) and other integrated circuit(s) (not shown)) may be disposed on the same and/or opposite sides of printed circuit board (320). That is, an integrated circuit (not shown) may be disposed where gap pad (324) is shown and may make thermally conductive contact with vapor chamber C (312.3). Additionally, one or more integrated circuit(s) (not shown) may be offset from the center of printed circuit board (320) and disposed nearer to the edges of printed circuit board (320) than integrated circuit (322). Accordingly, embodiments disclosed herein should not be limited to the configuration of devices and/or components shown in FIG. 3A.

Figure 3B:
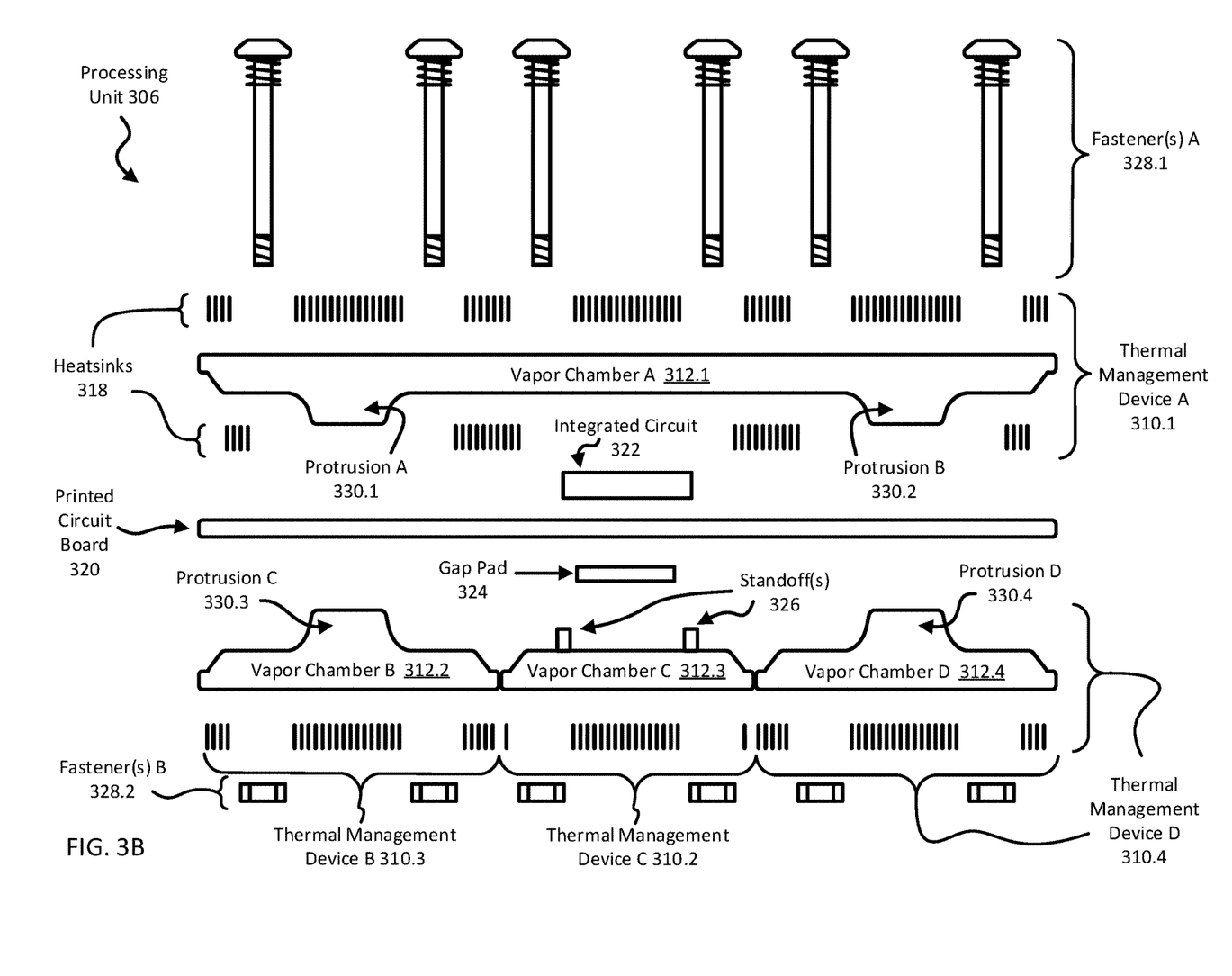
FIG. 3B shows an example of the components of a processing unit, in accordance with one or more embodiments.

FIG. 3B shows an example of the components of a processing unit separated apart, in accordance with one or more embodiments. Similarly named and/or similarly numbered components of FIG. 3B have all of the same properties as discussed in the description of FIG. 3A.

In one or more embodiments, as shown in FIG. 3B, a fastener (e.g., fastener(s) A (328.1), fastener(s) B (328.2)) may be constructed of two or more components. As a non-limiting example, as shown in FIG. 3B, fastener(s) A (328.1) are bolts and/or machine screws with external threads and fastener(s) B (328.2) are nuts with internal threads adapted to mechanically couple with fastener(s) A (328.1). One of ordinary skill in the art, having the benefit of this Detailed Description, would appreciate how mechanically coupling a nut and bolt through other components provides mechanical coupling to those other components.

While FIG. 3B shows an example of a processing unit, other configurations may be used without departing from the scope. Accordingly, embodiments disclosed herein should not be limited to the configuration of devices and/or components shown in FIG. 3B.

Figure 4A:
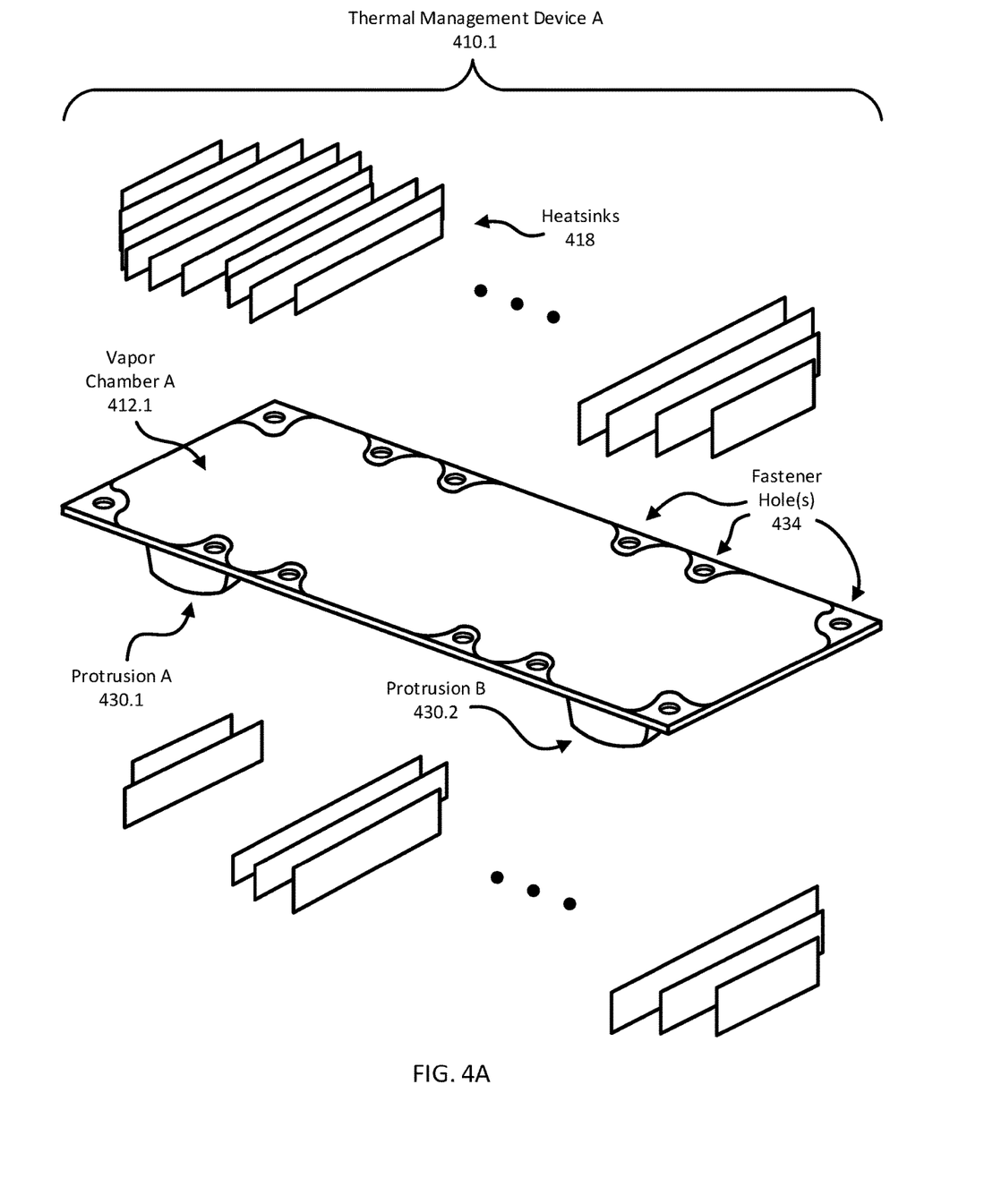
FIG. 4A shows an exploded view of an example of a thermal management device, in accordance with one or more embodiments.

FIG. 4A shows an exploded view of an example of a thermal management device, in accordance with one or more embodiments. In one or more embodiments, thermal management device A (410.1) of FIG. 4A is similar to thermal management device A (310.1) of FIGS. 3A and 3B. Accordingly, similarly named and/or similarly numbered components of FIG. 4A have all of the same properties as discussed in the description of FIGS. 3A and 3B. In one or more embodiments, thermal management device A (410.1) includes heatsinks (e.g., heatsinks (418)), a vapor chamber (e.g., vapor chamber A (412.1)), one or more protrusions (e.g., protrusion A (430.1), protrusion B (430.2)), and one or more fastener hole(s) (e.g., fastener hole(s) (434)).

In one or more embodiments, a fastener hole (e.g., fastener hole(s) (434)) is a hole (e.g., an unobstructed opening) that traverses the thickness of a component (e.g., vapor chamber A (412.1)) and provides a pathway for one or more fastener(s) (not shown) to traverse the thickness of the component. Fastener hole(s) (434) may be vertically aligned with fastener hole(s) (not shown) of other components of the processing unit to enable one or more fastener(s) to traverse two or more components concurrently (and/or the processing unit as a whole). In one or more embodiments, the area around fastener hole(s) (434) may provide an area for vertical physical contact with a fastener (e.g., the underside of a screw head).

While FIG. 4A shows an example of a thermal management device, other configurations may be used without departing from the scope. Accordingly, embodiments disclosed herein should not be limited to the configuration of devices and/or components shown in FIG. 4A.

Figure 4B:
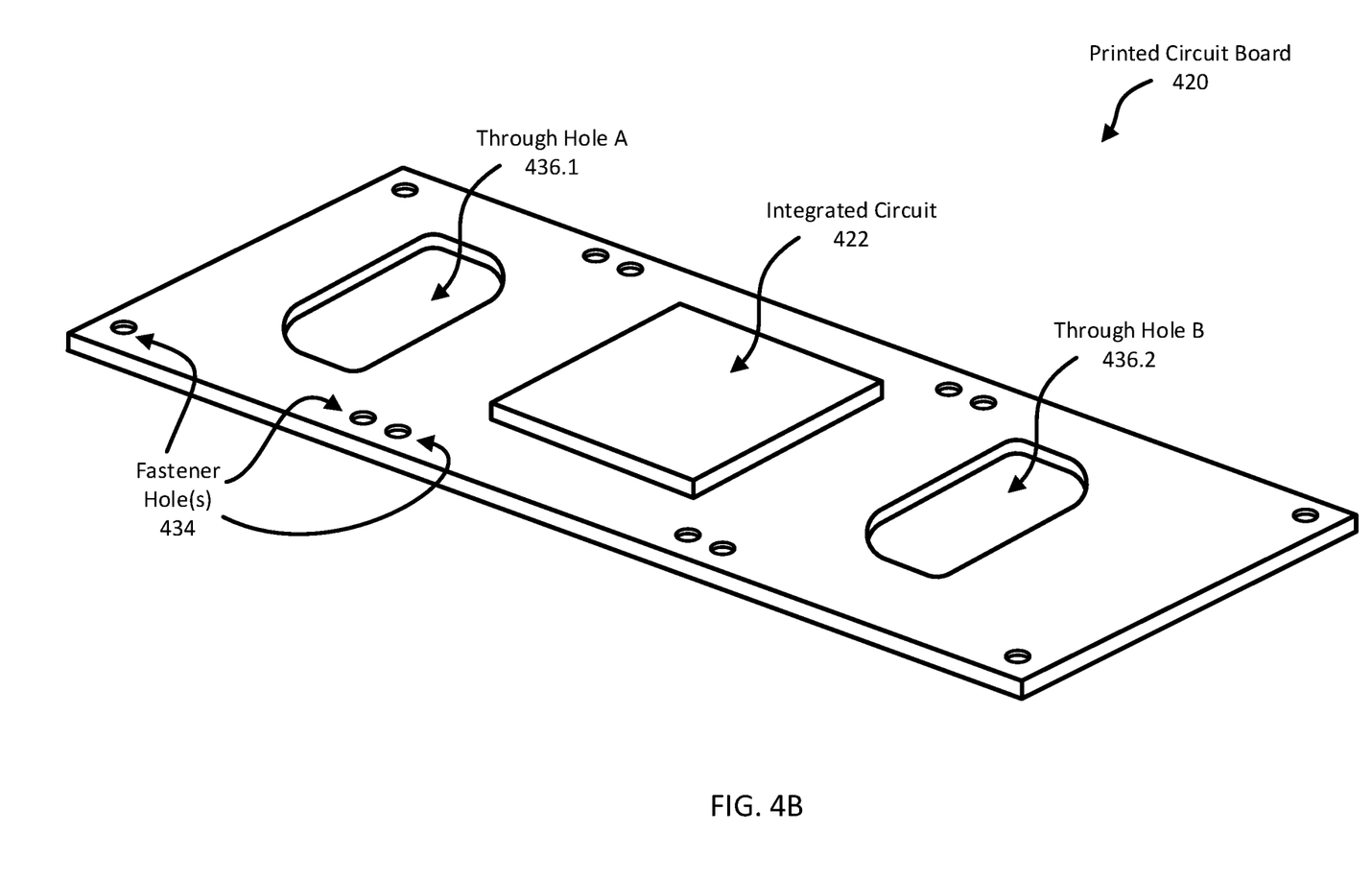
FIG. 4B shows an example of a printed circuit board, in accordance with one or more embodiments.

FIG. 4B shows an example of a printed circuit board, in accordance with one or more embodiments. In one or more embodiments, printed circuit board (420) is similar to printed circuit board (320) of FIGS. 3A and 3B. Further, similarly named and/or similarly numbered components of FIG. 4B have all of the same properties as discussed in the description of FIGS. 3A, 3B, and 4A. In one or more embodiments, printed circuit board (420) includes an integrated circuit (e.g., integrated circuit (422)), one or more fastener hole(s) (e.g., fastener hole(s) (434)), one or more through holes (e.g., through hole A (436.1), through hole B (436.2)), and one or more TSVs (not shown).

In one or more embodiments, a through hole (e.g., through hole A (436.1), through hole B (436.2)) is hole (e.g., an unobstructed opening) that traverses the thickness of printed circuit board (420) and allows for one or more protrusion(s) (not shown) to traverse therethrough. As a non-limiting example, protrusion B of thermal management device B (not shown) may traverse and/or partially traverse through hole A (436.1) from the underside (the side opposite integrated circuit (422)) in order to establish a thermal contact with protrusion A of thermal management device A (not shown) (which may also traverse and/or partially traverse through hole A (436.1)).

In one or more embodiments, TSVs (not shown) may be disposed throughout printed circuit board (420) and traverse the thickness of printed circuit board (420). Further, in one or more embodiments, TSVs may be more thermally conductive than other material(s) that compose printed circuit board (420) thereby allowing heat to transfer through printed circuit board (420) through the TSVs. Accordingly, TSVs disposed in printed circuit board (420) under integrated circuit (422) may provide thermally conductive pathway through which heat is transferred from integrated circuit (422) to a gap pad (not shown) located beneath printed circuit board (420).

In one or more embodiments, protrusions may be of varying height, and therefore only a single protrusion may traverse a through hole (e.g., 436.1, 436.2). As a non-limiting example, protrusion B of thermal management device B (not shown) may have greater height (i.e., vertical length) than protrusion A of thermal management device A (not shown); thus, protrusion B of thermal management device B (not shown) may traverse the entirety of through hole (436.1) and physically contact protrusion A of thermal management device A at a height above the surface of printed circuit board (420).

While FIG. 4B shows an example of a printed circuit board, other configurations may be used without departing from the scope. For example, although printed circuit board (420) is shown with two through holes (436.1, 436.2), printed circuit board (420) may include only one through hole if only one protrusion (or protrusion couple) are present in the processing unit (similarly, printed circuit board (420) may include three or more through holes that correspond to a respective number of protrusions). Further, as a non-limiting example, through holes (436.1, 436.2) may be disposed at the edges of printed circuit board (420) such that the through holes may only be notches (i.e., not encircled by printed circuit board (420)) but still allow for one or more protrusion(s) to traverse the thickness of printed circuit board (420). Accordingly, embodiments disclosed herein should not be limited to the configuration of devices and/or components shown in FIG. 4B.

Figure 4C:
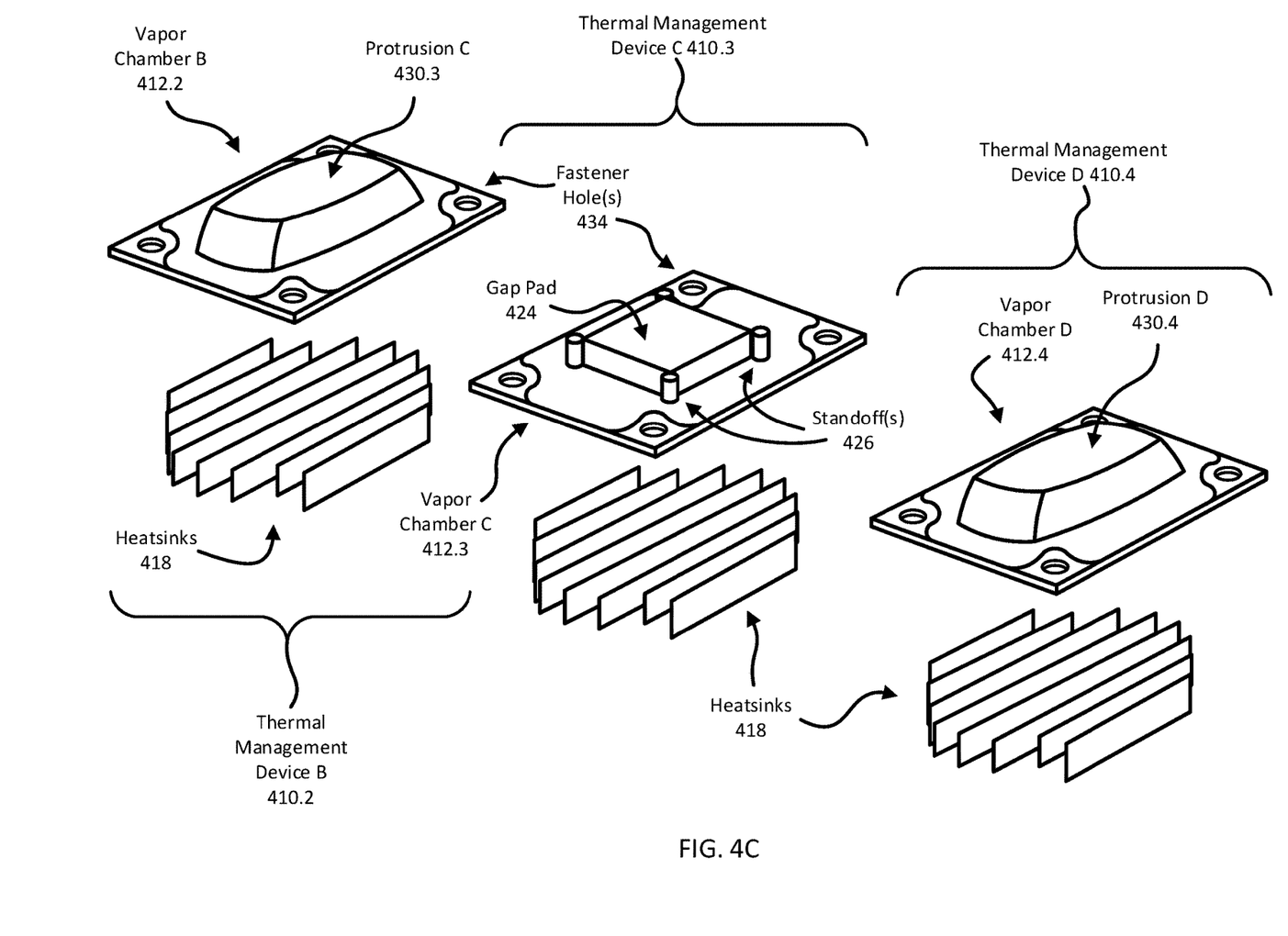
FIG. 4C shows an exploded view of an example of one or more thermal management device(s), in accordance with one or more embodiments.

FIG. 4C shows an exploded view of an example of one or more thermal management device(s), in accordance with one or more embodiments. In one or more embodiments, thermal management device B (410.2), thermal management device C (410.3), thermal management device D (410.3) are similar to thermal management device B (310.2), thermal management device C (310.3), and thermal management device D (310.3) of FIGS. 3A and 3B. Further, similarly named and/or similarly numbered components of FIG. 4C have all of the same properties as discussed in the description of FIGS. 3A, 3B, 4A, and 4B.

In one or more embodiments, thermal management device B (410.2) includes a vapor chamber (e.g., vapor chamber B (412.2)), a protrusion (e.g., protrusion C (430.3)), one or more fastener hole(s) (e.g., fastener hole(s) (434)), and heatsinks (e.g., heatsinks (418)). Further, in one or more embodiments, thermal management device C (410.3) includes a vapor chamber (e.g., vapor chamber C (412.3)), heatsinks (e.g., heatsinks (418)), one or more fastener hole(s) (e.g., fastener hole(s) (434)), one or more standoff(s) (e.g., standoff(s) (426)) and a gap pad (e.g., gap pad (424)). And, in one or more embodiments, thermal management device D (410.4) includes a vapor chamber (e.g., vapor chamber D (412.4)), a protrusion (e.g., protrusion D (430.4)), one or more fastener hole(s) (e.g., fastener hole(s) (434)), and heatsinks (e.g., heatsinks (418)).

In one or more embodiments, the combination of two or more laterally disposed thermal management devices (e.g., thermal management device B (410.2), thermal management device C (410.3), and thermal management device D (410.4)) may be considered a single "thermal management device". As a non-limiting example, because thermal management device B (410.2), thermal management device C (410.3), and thermal management device D (410.4) are laterally disposed adjacent to each other and disposed opposite a single thermal management device A (not shown), the combination of thermal management devices (410.2, 410.3, 410.4), while separate, may operate as a single unit.

While FIG. 4C shows an example of one or more thermal management device(s), other configurations may be used without departing from the scope. Accordingly, embodiments disclosed herein should not be limited to the configuration of devices and/or components shown in FIG. 4C.

As articulated above, specific embodiments are described with reference to the accompanying figures. In the preceding description, numerous details were set forth as examples. One of ordinary skill in the art, having the benefit of this Detailed Description, would appreciate that one or more embodiments described above may be practiced without the explicitly articulated details, and that numerous variations or modifications may be possible without departing from the scope. For example, although the processing unit is shown to be generally rectangular, the processing unit may take any shape of the components from which it is constructed (e.g., an oval-shaped printed circuit board, square thermal management device(s), wavy-shaped fins, and/or any combination thereof). Further, one or more components of the processing unit may be differently sized than as shown in the accompanying figures (e.g., the printed circuit board may extend beyond the footprint of the thermal management devices, or the printed circuit board may be much smaller (e.g., mostly covered by an integrated circuit) than the footprint of the thermal management devices. Accordingly, certain details known to those of ordinary skill in the art may be omitted to avoid obscuring the description.

In the preceding description of the figures, any component described with regard to a figure, in various embodiments, may be equivalent to one or more like-named components shown and/or described with regard to any other figure. For brevity, descriptions of these components were not repeated with regard to each figure. Thus, each and every embodiment of the components of each figure is incorporated by reference and assumed to be optionally present within every other figure having one or more like-named components. Additionally, in accordance with various embodiments, any description of any component of a figure is to be interpreted as an optional embodiment, which may be implemented in addition to, in conjunction with, or in place of the embodiments described with regard to a corresponding like-named component in any other figure.

Throughout this application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

As used herein, the term 'operatively connected', or 'operative connection', means that there exists between elements/components/devices a direct or indirect connection that allows the elements to interact with one another in some way (e.g., via the exchange of information). For example, the phrase 'operatively connected' may refer to any direct (e.g., wired or wireless connection directly between two devices) or indirect (e.g., wired and/or wireless connections between any number of devices connecting the operatively connected devices) connection.

While one or more embodiments have been described herein with respect to a limited number of embodiments and examples, one of ordinary skill in the art, having the benefit of this Detailed Description, would appreciate that other embodiments can be devised which do not depart from the scope of the embodiments disclosed herein. Accordingly, the scope should be limited only by the attached claims.

What is claimed is:

1. A compute unit comprising:
    a printed circuit board (PCB) comprising an integrated circuit;
    a first thermal management device, comprising:
        a first vapor chamber thermally conductively coupled to a first side of the integrated circuit and having a first protrusion; and
        a first heatsink thermally conductively coupled to the first vapor chamber; and
    a second thermal management device, comprising:
        a second vapor chamber having a second protrusion; and
        a second heatsink thermally conductively coupled to the second vapor chamber,
    wherein the PCB is interposed between the first thermal management device and the second thermal management device, and
    wherein the PCB comprises a through hole through which the second protrusion of the second vapor chamber is thermally conductively coupled to the first protrusion of the first vapor chamber.

2. The compute unit of claim 1, wherein the first protrusion, at least, partially traverses the through hole.

3. The compute unit of claim 1, wherein the second thermal management device further comprises:
    a third vapor chamber, physically coupled to the second vapor chamber; and
    a fourth vapor chamber, physically coupled to the third vapor chamber.

4. The compute unit of claim 3, wherein the fourth vapor chamber comprises a third protrusion, wherein the first thermal management device and the second thermal management device are thermally conductively coupled via the third protrusion.

5. The compute unit of claim 1, wherein the first thermal management device is physically coupled to the second thermal management device using a fastener, wherein the fastener is one selected from the group consisting of a bolt and a machine screw.

6. The compute unit of claim 5, wherein the first thermal management device and the second thermal management device exert a force on the integrated circuit, wherein the force increases when the fastener is manipulated to reduce a distance between the first thermal management device and the second thermal management device.

7. The compute unit of claim 1, wherein the compute unit comprises an air mover configured to force a movement of gaseous matter towards the first thermal management device, and wherein the first heatsink comprises fins, and wherein the fins are oriented to align with the movement of the gaseous matter.

8. The compute unit of claim 1, wherein the first protrusion of the first vapor chamber extends toward the through hole of the PCB and wherein the second protrusion of the second vapor chamber extends toward to the through hole of the PCB.

9. A processing unit, comprising:
    a printed circuit board having first and second opposing sides;
    an integrated circuit on the first side of the printed circuit board;
    a first thermal management device on the first side of printed circuit board, comprising:
        a first vapor chamber thermally conductively coupled to the integrated circuit; and
        a first heatsink thermally conductively coupled to the first vapor chamber; and
    a second thermal management device on the second side of the printed circuit board, comprising:
        a second vapor chamber; and
        a second heatsink thermally conductively coupled to the second vapor chamber,
    wherein the first vapor chamber comprises a first protrusion that contacts the second thermal management device, and
    wherein the first thermal management device and the second thermal management device are thermally conductively coupled via the first protrusion.

10. The processing unit of claim 9, wherein the printed circuit board is disposed between the first thermal management device and the second thermal management device, wherein the integrated circuit is disposed on a surface of the printed circuit board, wherein the printed circuit board comprises a through hole, and wherein the first protrusion, at least, partially traverses the through hole.

11. The processing unit of claim 10, wherein the second vapor chamber comprises a second protrusion, wherein thermally conductively coupling the first thermal management device and the second thermal management device comprises thermally conductively coupling the first protrusion and the second protrusion.

12. The processing unit of claim 9, wherein the second thermal management device further comprises:
    a third vapor chamber, physically coupled to the second vapor chamber; and
    a fourth vapor chamber, physically coupled to the second vapor chamber.

13. The processing unit of claim 12, wherein the third vapor chamber comprises a second protrusion, wherein the first thermal management device and the second thermal management device are thermally conductively coupled via the second protrusion.

14. The processing unit of claim 13, wherein the fourth vapor chamber comprises a third protrusion, wherein the first thermal management device and the second thermal management device are thermally conductively coupled via the third protrusion.

15. The processing unit of claim 9, wherein the first thermal management device is physically coupled to the second thermal management device using a fastener, wherein the fastener is one selected from the group consisting of a bolt and a machine screw.

16. The processing unit of claim 15, wherein the first thermal management device and the second thermal management device exert a force on the integrated circuit, wherein the force increases when the fastener is manipulated to reduce a distance between the first thermal management device and the second thermal management device.

17. The processing unit of claim 9, wherein the first protrusion of the first vapor chamber contacts the second vapor chamber.

18. The processing unit of claim 17, wherein the first protrusion of the first vapor chamber has a distal end that makes thermally conductive contact with the second vapor chamber.

19. The processing unit of claim 9, wherein the printed circuit board has a through hole and wherein the first protrusion at least partially traverses the through hole of the printed circuit board.

20. A processing unit, comprising:
an integrated circuit;
a first thermal management device, comprising:
    a first vapor chamber thermally conductively coupled to a first side of the integrated circuit; and
    a first heatsink thermally conductively coupled to the first vapor chamber; and
a second thermal management device, comprising:
    a second vapor chamber;
    a second heatsink thermally conductively coupled to the second vapor chamber; and
    a third vapor chamber, physically coupled to the second vapor chamber,
wherein the second thermal management device is thermally conductively coupled to the first thermal management device,
wherein the third vapor chamber comprises a first protrusion, and
wherein the first thermal management device and the second thermal management device are thermally conductively coupled via the first protrusion.

* * * * *